United States Patent
Hirayama et al.

(10) Patent No.: US 12,272,526 B2
(45) Date of Patent: Apr. 8, 2025

(54) SUBSTRATE PROCESSING METHOD AND SUBSTRATE PROCESSING APPARATUS

(71) Applicant: TOKYO ELECTRON LIMITED, Tokyo (JP)

(72) Inventors: Tsukasa Hirayama, Miyagi (JP); Taku Gohira, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 173 days.

(21) Appl. No.: 17/704,575

(22) Filed: Mar. 25, 2022

(65) Prior Publication Data

US 2022/0310361 A1    Sep. 29, 2022

(30) Foreign Application Priority Data

Mar. 26, 2021  (JP) ................. 2021-053825

(51) Int. Cl.
*H01J 37/32*    (2006.01)

(52) U.S. Cl.
CPC ... *H01J 37/32449* (2013.01); *H01J 37/32082* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2012/0015520 A1* | 1/2012 | Greeley | H01L 21/0337 257/E21.231 |
| 2017/0178920 A1* | 6/2017 | Dole | H01J 37/32137 |
| 2020/0066540 A1* | 2/2020 | Hudson | H01L 21/31116 |
| 2021/0005472 A1* | 1/2021 | Kanarik | H01L 21/31116 |

FOREIGN PATENT DOCUMENTS

| | | |
|---|---|---|
| JP | 2008-060566 A | 3/2008 |
| JP | 2019-207911 A | 12/2019 |

\* cited by examiner

*Primary Examiner* — Binh X Tran
(74) *Attorney, Agent, or Firm* — XSENSUS LLP

(57) ABSTRACT

A substrate processing method includes: (a) providing a substrate including an etching target film and a mask formed on the etching target film and having an opening; (b) forming a first layer containing a nitrogen atom and a hydrogen atom by using a first processing gas, on a side wall of a recess that is formed in the etching target film corresponding to the opening; (c) after (b), modifying the first layer into a second layer by using a second processing gas containing a halogen-containing gas; and (d) after (c), etching the recess by using a third processing gas.

18 Claims, 8 Drawing Sheets

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2021-053825, filed on Mar. 26, 2021 with the Japan Patent Office, the disclosure of which is incorporated herein in its entirety by reference.

TECHNICAL FIELD

The present disclosure relates to a substrate processing method and a substrate processing apparatus.

BACKGROUND

Japanese Patent Laid-Open Publication No. 2008-060566 discloses a method of forming a recess in a dielectric layer through etching. In this method, a mask is formed on a dielectric layer. Next, a protective silicon-containing film is formed on the mask. Next, a recess is formed through etching by using the mask and the protective silicon-containing film.

SUMMARY

In one embodiment, a substrate processing method is provided. The substrate processing method includes (a) providing a substrate including an etching target film and a mask formed on the etching target film and having an opening; (b) forming a first layer containing a nitrogen atom and a hydrogen atom by using a first processing gas, on a side wall of a recess that is formed in the etching target film corresponding to the opening; (c) after (b), modifying the first layer into a second layer by using a second processing gas containing a halogen-containing gas; and (d) after (c), etching the recess by using a third processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
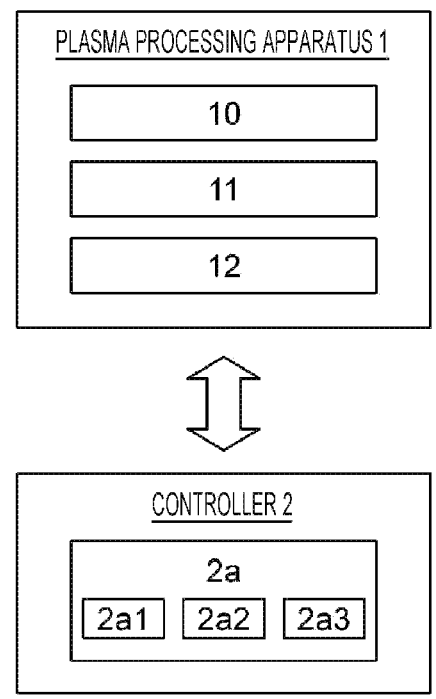
FIG. 1 is a view schematically illustrating a substrate processing apparatus according to one embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In one embodiment, a substrate processing method includes (a) providing a substrate including an etching target film and a mask formed on the etching target film and having an opening; (b) forming a first layer containing a nitrogen atom and a hydrogen atom by using a first processing gas, on a side wall of a recess that is formed in the etching target film corresponding to the opening; (c) after (b), modifying the first layer into a second layer by using a second processing gas containing a halogen-containing gas; and (d) after (c), etching the recess by using a third processing gas.

According to the method of the embodiment, in (d), the etching of the side wall of the recess is suppressed because the second layer is formed on the side wall of the recess. Therefore, it is possible to suppress a shape defect of the side wall of the recess in the etching.

In (b), a first plasma generated from the first processing gas may be used, in the step (d), a second plasma generated from the third processing gas may be used, and in the step (c), the second processing gas containing the halogen-containing gas may be used without generating a plasma. In this case, in (c), since no plasma is generated, the mask is suppressed from being etched by a plasma.

The above method may further include, after (d), repeating (b), (c), and (d). In this case, it is possible to form a deep recess.

In the above method, (d) may be performed simultaneously with (d) subsequent to (d). In this case, it is possible to form the first layer on the side wall of the recess while etching the recess.

The etching target film may include a silicon-containing film. In this case, it is possible to form a recess in the silicon-containing film.

The silicon-containing film may include a silicon-containing film that contains nitrogen, and the first processing gas may contain a hydrogen atom.

The silicon-containing film may include a silicon-containing film that does not contain nitrogen, and the first processing gas may contain a hydrogen atom and a nitrogen atom.

The halogen-containing gas may contain a halogen compound having a polarity. In this case, the reactivity of the halogen-containing gas to the first layer is increased.

The halogen compound may contain hydrogen halide.

The first layer may contain ammonia or a compound having an amino group.

The second layer may contain ammonium halide or amine halide.

In the step (d), a bias power may be applied to a substrate support that supports the substrate. In this case, it is possible to selectively etch the recess.

In one embodiment, a substrate processing apparatus includes: a chamber; a substrate support that supports a substrate within the chamber, the substrate including an etching target film and a mask formed on the etching target film and having an opening; a gas supply that supplies at least one of a first processing gas, a second processing gas, and a third processing gas into the chamber, the second processing gas containing a halogen-containing gas; and a controller. The controller is configured to control the gas supply to: (a) form a first layer containing a nitrogen atom and a hydrogen atom by using the first processing gas, on a side wall of a recess that is formed in the etching target film corresponding to the opening; (b) after (a), modify the first layer into a second layer by using the second processing gas; and (c) after (b), etch the recess by using the third processing gas.

In one embodiment, a substrate processing method includes (a) providing a substrate including an etching target film and a mask formed on the etching target film and having an opening; (b) exposing the substrate to a first processing gas, the first processing gas being capable of forming a first layer containing a nitrogen atom and a hydrogen atom, on a side wall of a recess that is formed in the etching target film corresponding to the opening; (c) after (b), exposing the substrate to a second processing gas containing a halogen-containing gas, the second processing gas being capable of modifying the first layer into a second layer; and (d) after (c), exposing the substrate to a third processing gas, the third processing gas being capable of etching the recess.

Hereinafter, various embodiments will be described in detail with reference to drawings. The same reference numerals are given to the same or equivalent parts in the drawings.

Figure 2:
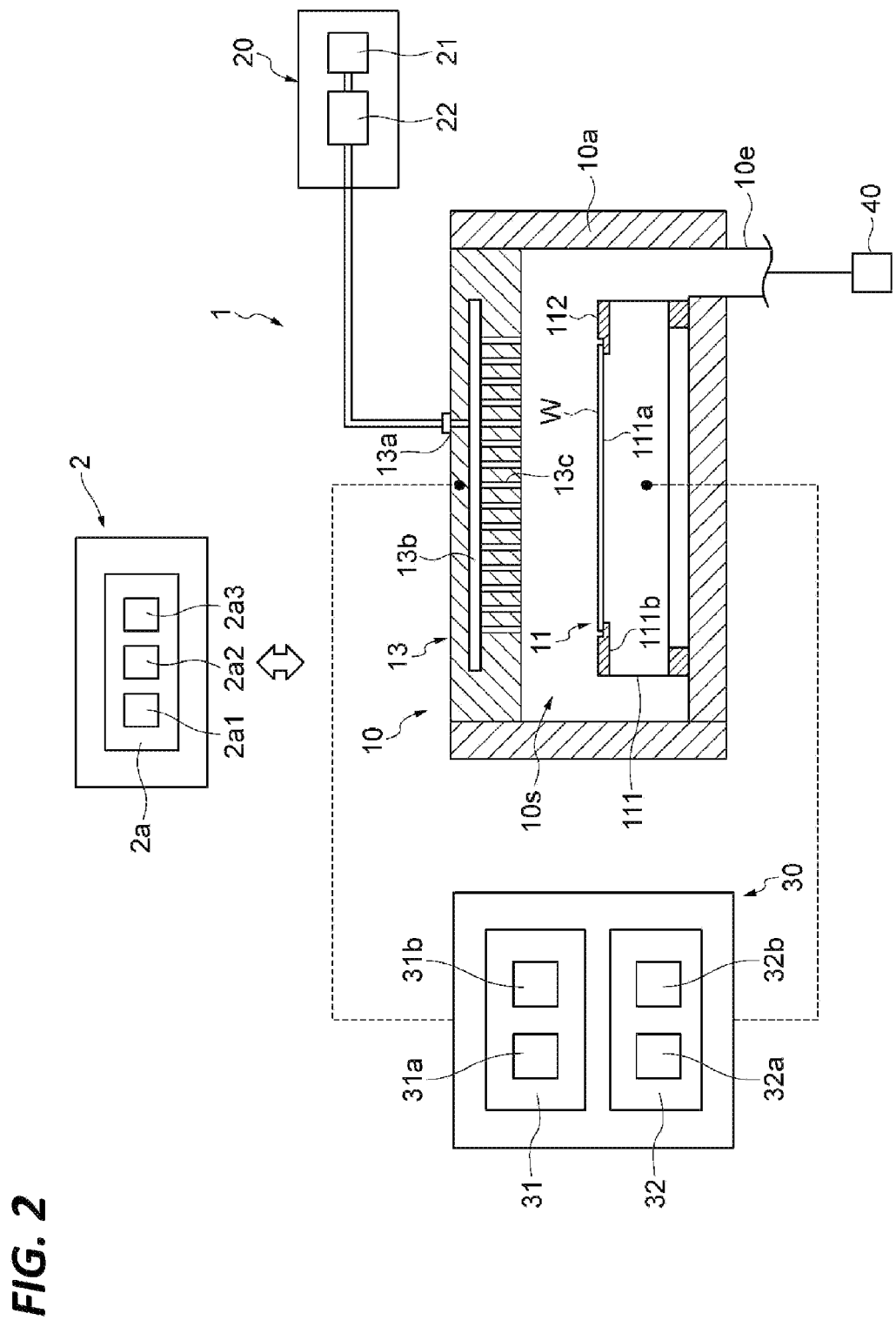
FIG. 2 is a view schematically illustrating the substrate processing apparatus according to one embodiment.

FIG. 1 and FIG. 2 are views schematically illustrating a substrate processing apparatus according to one embodiment. The substrate processing apparatus of the present embodiment is, for example, a plasma processing system.

In one embodiment, the plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. The plasma processing chamber 10 has at least one gas supply port that supplies at least one processing gas to the plasma processing space, and at least one gas discharge port that discharges a gas from the plasma processing space. The gas supply port is connected to a gas supply 20 to be described below, and the gas discharge port is connected to an exhaust system 40 to be described below. The substrate support 11 is disposed within the plasma processing space and has a substrate support surface that supports a substrate.

The plasma generator 12 is configured to generate a plasma from at least one processing gas supplied into the plasma processing space. The plasma formed in the plasma processing space may be, for example, capacitively coupled plasma (CCP), inductively coupled plasma (ICP), electron-cyclotron-resonance plasma (ECR plasma), helicon wave plasma (HWP), or surface wave plasma (SWP). Various types of plasma generators, including an alternating current (AC) plasma generator and a direct current (DC) plasma generator, may be used. In one embodiment, the AC signal (AC power) used in the AC plasma generator has a frequency in a range of 100 kHz to 10 GHz. Therefore, the AC signal includes a radio frequency (RF) signal and a microwave signal. In one embodiment, the RF signal has a frequency in a range of 200 kHz to 150 MHz.

The controller 2 processes computer-executable instructions that cause the plasma processing apparatus 1 to execute various steps described in the present disclosure. The controller 2 may be configured to control each element of the plasma processing apparatus 1 so as to execute various steps described herein. In one embodiment, a part or all of the controller 2 may be included in the plasma processing apparatus 1. The controller 2 may include, for example, a computer 2a. The computer 2a may include, for example, a processor (CPU: central processing unit) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Hereinafter, a configuration example of the plasma processing system will be described.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. The plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed within the plasma processing chamber 10. The shower head 13 is disposed above the substrate support 11. In one embodiment, the shower head 13 constitutes at least a part of the ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 has at least one gas supply port that supplies at least one processing gas to the plasma processing space 10s, and at least one gas discharge port that discharges the gas from the plasma processing space. The side wall 10a is grounded. The shower head 13 and the substrate support 11 are electrically insulated from the housing of the plasma processing chamber 10.

The substrate support 11 includes a main body 111 and a ring assembly 112. The main body 111 has a central region (substrate support surface) 111a that supports a substrate (wafer) W, and an annular region (ring support surface) 111b that supports the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 so as to surround the substrate W on the central region 111a of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has the substrate support surface 111a. The ring assembly 112 includes one or more annular members. At least one of one or more annular members is an edge ring. Although not illustrated, the substrate support 11 may include a temperature control module that adjusts at least one of the electrostatic chuck, the ring assembly 112, and the substrate to a target temperature. The temperature control module may include a heater, a heat transfer medium, a flow path, or a combination thereof. Through the flow path, a heat transfer fluid such as brine or gas flows. The substrate support 11 may include a heat transfer gas supply that supplies a heat transfer gas between the back surface of the substrate W and the substrate support surface 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a is introduced from the plurality of gas introduction ports 13c into the plasma processing space 10s through the gas diffusion chamber 13b. The shower head 13 includes a conductive member. The conductive member of the shower head 13 functions as an upper electrode. In addition to the shower head 13, the gas introduction unit may include one or more side gas injectors (SGIs) attached to one or more openings formed in the side wall 10a.

The gas supply 20 may include at least one gas source 21 and at least one flow rate controller 22. In one embodiment, the gas supply 20 is configured to supply at least one processing gas from each corresponding gas source 21 to the shower head 13 via each corresponding flow rate controller 22. Each flow rate controller 22 may include, for example, a mass flow controller or a pressure control-type flow rate controller. Further, the gas supply 20 may include one or more flow rate modulation devices that modulate or pulse the flow rate of at least one processing gas.

The power supply 30 includes an RF power supply 31 that is coupled to the plasma processing chamber 10 via at least one impedance matching circuit. The RF power supply 31 is configured to supply at least one RF signal (RF power) such as a source RF signal or a bias RF signal, to the conductive member of the substrate support 11 and/or the conductive member of the shower head 13. Accordingly, a plasma is formed from at least one processing gas supplied to the plasma processing space 10s. Therefore, the RF power supply 31 may function as at least a part of a plasma generator configured to generate a plasma from one or more processing gases in the plasma processing chamber 10. By supplying a bias RF signal to the conductive member of the substrate support 11, a bias potential is generated on the substrate W, so that the ionic component in the formed plasma may be drawn into the substrate W.

In one embodiment, the RF power supply 31 includes a first RF generator 31a and a second RF generator 31b. The first RF generator 31a is coupled to the conductive member of the substrate support 11 and/or the conductive member of the shower head 13 via at least one impedance matching circuit, and is configured to generate a source RF signal (source RF power) for plasma generation. In one embodiment, the source RF signal has a frequency in a range of 13 MHz to 150 MHz. In one embodiment, the first RF generator 31a may be configured to generate a plurality of source RF signals having different frequencies. The generated one or more source RF signals are supplied to the conductive member of the substrate support 11 and/or the conductive member of the shower head 13. The second RF generator 31b is coupled to the conductive member of the substrate support 11 via at least one impedance matching circuit, and is configured to generate a bias RF signal (bias RF power). In one embodiment, the bias RF signal has a frequency lower than the source RF signal. In one embodiment, the bias RF signal has a frequency in a range of 400 kHz to 13.56 MHz. In one embodiment, the second RF generator 31b may be configured to generate a plurality of bias RF signals having different frequencies. The generated one or more bias RF signals are supplied to the conductive member of the substrate support 11. In various embodiments, at least one of the source RF signal and the bias RF signal may be pulsed.

The power supply 30 may include a DC power supply 32 coupled to the plasma processing chamber 10. The DC power supply 32 includes a first DC generator 32a and a second DC generator 32b. In one embodiment, the first DC generator 32a is connected to the conductive member of the substrate support 11, and is configured to generate a first DC signal. The generated first DC signal is applied to the conductive member of the substrate support 11. In one embodiment, the first DC signal may be applied to another electrode such as an electrode within the electrostatic chuck. In one embodiment, the second DC generator 32b is connected to the conductive member of the shower head 13, and is configured to generate a second DC signal. The generated second DC signal is applied to the conductive member of the shower head 13. In various embodiments, at least one of the first and second DC signals may be pulsed. The first and second DC generators 32a and 32b may be provided in addition to the RF power supply 31, or the first DC generator 32a may be provided instead of the second RF generator 31b.

The exhaust system 40 may be connected to, for example, a gas discharge port 10e formed in the bottom of the plasma processing chamber 10. The exhaust system 40 may include a pressure regulation valve and a vacuum pump. The pressure within the plasma processing space 10s is adjusted by the pressure regulation valve. The vacuum pump may include a turbo molecular pump, a dry pump, or a combination thereof.

Figure 3:
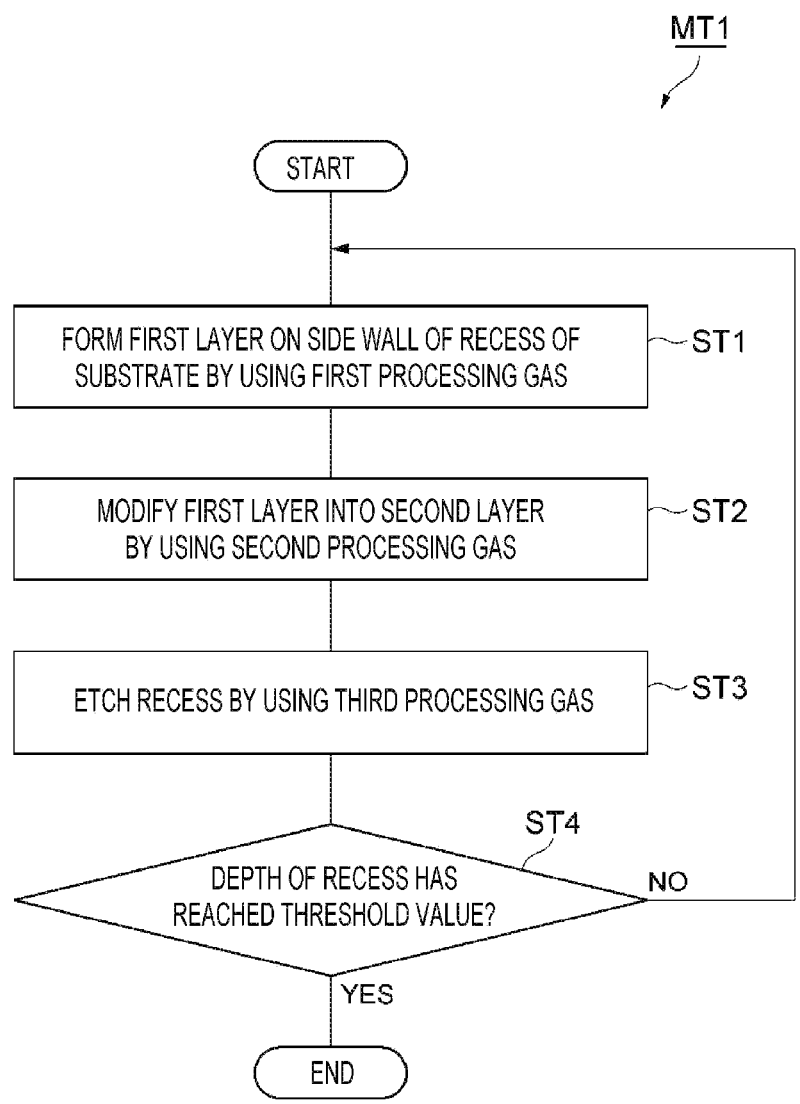
FIG. 3 is a flowchart of a substrate processing method according to one embodiment.

FIG. 3 is a flowchart of a substrate processing method according to one embodiment. The substrate processing method (hereinafter, referred to as a "method MT1") illustrated in FIG. 3 may be executed by the substrate processing apparatus of the embodiment. The method MT1 may be applied to the substrate W.

Figure 4:
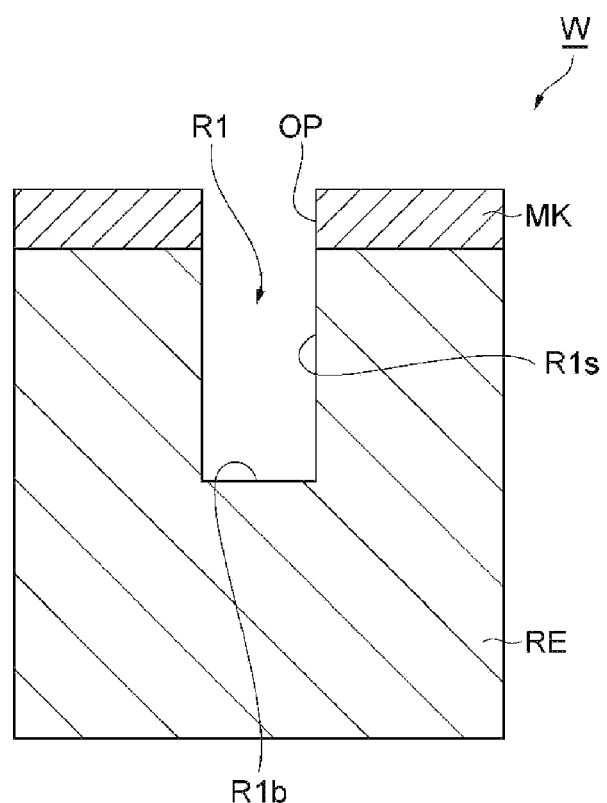
FIG. 4 is a sectional view of a part of an exemplary substrate in an enlarged scale.

FIG. 4 is a sectional view of a part of an exemplary substrate in an enlarged scale. As illustrated in FIG. 4, in one embodiment, the substrate W includes an etching target film RE and a mask MK. The mask MK is formed on the etching target film RE.

The etching target film RE may have a recess R1. The recess R1 has a side wall R1s and a bottom R1b. The recess R1 may be an opening. The recess R1 is, for example, a hole or a trench. The recess R1 may be formed through plasma etching using the plasma processing apparatus 1 as in step ST3 to be described below. The etching target film RE may have a plurality of recesses R1.

The etching target film RE may include a silicon-containing film. The silicon-containing film may be any single-layer film among a silicon oxide film ($SiO_2$ film), a silicon nitride film (SiN film), a silicon oxide nitride film (SiON film), a silicon carbide film (SiC film), a silicon carbide nitride film (SiCN film), an organic-containing silicon oxide film (SiOCH film), and a silicon film (Si film), or may be a stacked film including at least two types thereof. The silicon-containing film may be a multi-layer film in which at least two types of silicon-containing films are alternately arranged. The silicon nitride film (SiN film), the silicon oxide nitride film (SiON film), or the silicon carbide nitride film (SiCN film) is a silicon-containing film that contains nitrogen. The silicon oxide film ($SiO_2$ film), the silicon carbide film (SiC film), the organic-containing silicon oxide film (SiOCH film), or the silicon film (Si film) is a silicon-containing film that does not contain nitrogen. The silicon film (Si film) may be a single crystal silicon film, a polycrystalline silicon film (Poly-Si film), or an amorphous silicon film ($\alpha$-Si film).

The mask MK has an opening OP. The recess R1 is formed in the etching target film RE corresponding to the opening OP. The width of the opening OP may be, for example, 100 nm or less. A distance between adjacent openings OP may be, for example, 100 nm or less.

The mask MK may include an organic film. The organic film may include at least one of a spin-on-carbon (SOC) film and an amorphous carbon film.

Figure 5:
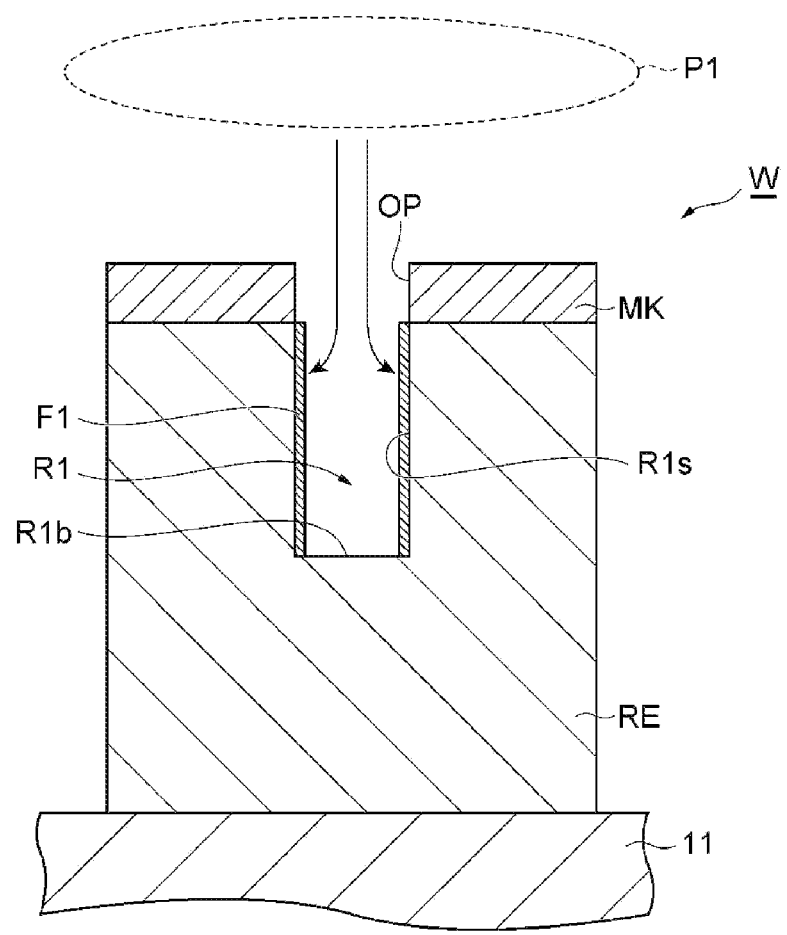
FIG. 5 is a sectional view illustrating one step of the substrate processing method according to one embodiment.
Figure 6:
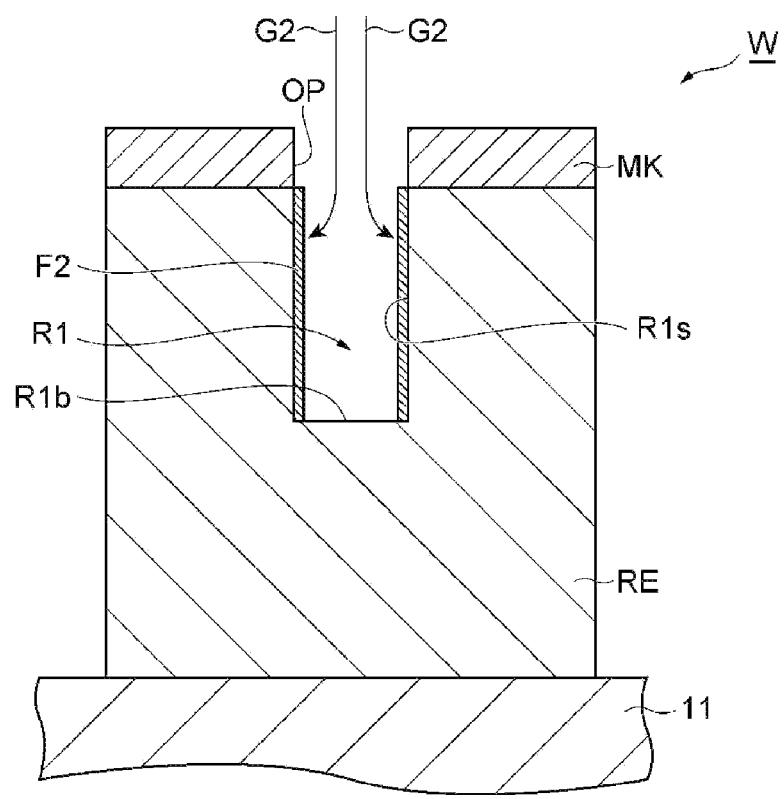
FIG. 6 is a sectional view illustrating one step of the substrate processing method according to one embodiment.
Figure 7:
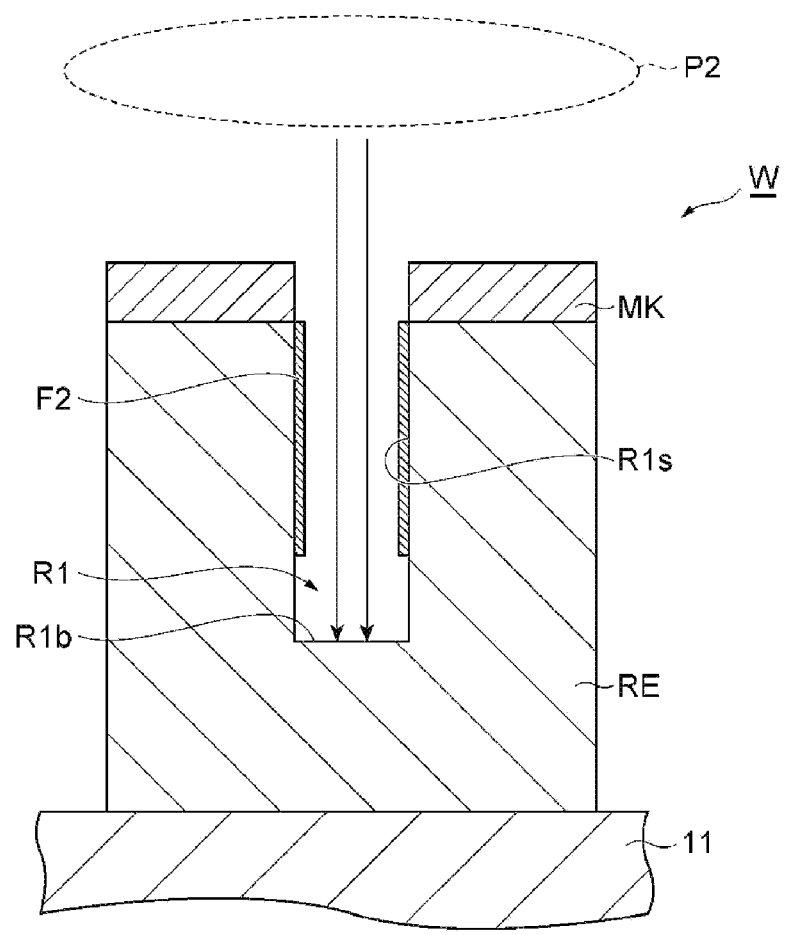
FIG. 7 is a sectional view illustrating one step of the substrate processing method according to one embodiment.
Figure 8:
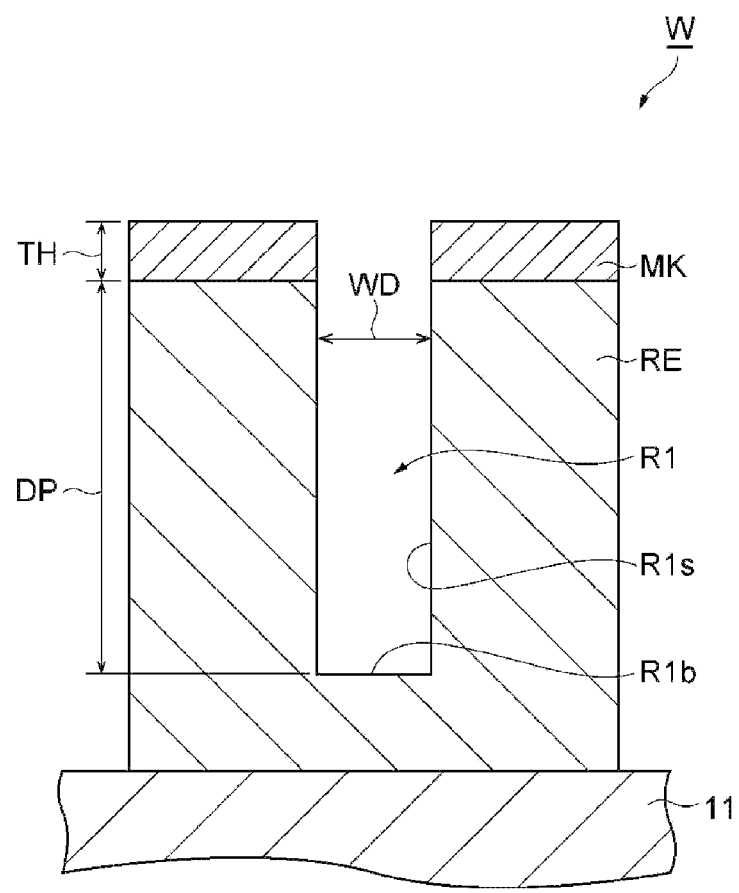
FIG. 8 is a sectional view of a part of an exemplary substrate obtained by executing the substrate processing method according to one embodiment, in an enlarged scale.

Hereinafter, the method MT1 will be described with reference to FIGS. 3 to 8 by taking, as an example, the case where the method MT1 is applied to the substrate W by using the substrate processing apparatus of the embodiment. Each of FIGS. 5 to 7 is a sectional view illustrating one step of the substrate processing method according to one embodiment. FIG. 8 is a sectional view of a part of an exemplary substrate obtained by executing the substrate processing method according to one embodiment, in an enlarged scale. When the plasma processing apparatus 1 is used, the method MT1 may be executed in the plasma processing apparatus 1 through the control by the controller 2 on each unit of the plasma processing apparatus 1. In the method MT1, as illustrated in FIG. 2, the substrate W on the substrate support 11 disposed within the plasma processing chamber 10 is processed. The substrate W may be etched by the method MT1.

As illustrated in FIG. 3, the method MT1 includes step ST1, step ST2, step ST3, and step ST4. Steps ST1 to ST4 may be executed in this order. Step ST4 may be performed simultaneously with step ST3. Step ST3 may be performed simultaneously with step ST1 subsequent to step ST3. In steps ST1 to ST4, the substrate W may be processed in situ. In steps ST1 to ST4, the temperature of the substrate support 11 that supports the substrate W may be adjusted to 30° C. or less.

As illustrated in FIG. 5, in step ST1, for example, a first plasma P1 is used to form a first layer F1 on the side wall R1s of the recess R1 of the substrate W. In step ST1, the substrate W may be exposed to the first plasma P1. The first plasma P1 is capable of forming the first layer F1 on the side wall R1s of the recess R1 of the substrate W. The first plasma P1 is generated from a first processing gas. The first plasma P1 may be generated by the plasma generator 12 of the plasma processing apparatus 1. The first processing gas may be supplied from the gas supply 20 of the plasma processing apparatus 1 into the plasma processing chamber 10.

The first processing gas may contain at least one of a hydrogen atom and a nitrogen atom. The first processing gas may contain at least one of a hydrogen-containing gas, a nitrogen-containing gas, an oxygen-containing gas, and a fluorine-containing gas. The hydrogen-containing gas may include $H_2$ gas. The nitrogen-containing gas may include $N_2$ gas. The gas containing the hydrogen atom and the nitrogen atom may include ammonia ($NH_3$) gas. The oxygen-containing gas may include at least one of $O_2$ gas, CO gas, and $CO_2$ gas. The fluorine-containing gas may include fluorocarbon gas. The fluorocarbon gas may include at least one of $C_4F_6$ gas, $C_4F_8$ gas, $C_3F_8$ gas, and $CF_4$ gas. The first processing gas may not contain hydrogen halide. When the etching target film RE includes a silicon-containing film that contains nitrogen, such as, for example, a silicon nitride film, the first processing gas may contain a hydrogen atom. In this case, the nitrogen atom in the silicon-containing film and the hydrogen atom in the first processing gas are contained in the first layer F1. When the etching target film RE includes a silicon-containing film that does not contain nitrogen, such as, for example, a silicon oxide film, the first processing gas may contain a hydrogen atom and a nitrogen atom. In this case, the hydrogen atom and the nitrogen atom in the first processing gas are contained in the first layer F1. When the etching target film RE contains a hydrogen atom, the first processing gas may not contain the hydrogen atom.

The first layer F1 contains a nitrogen atom and a hydrogen atom. The first layer F1 may contain ammonia ($NH_3$), or a compound having an amino group ($-NH_2$). The first layer F1 is, for example, an ammonia adsorption layer. The first layer F1 is formed as a result of an interaction (for example, adsorption or chemical reaction) between the first plasma P1 and the etching target film RE. Due to the aspect ratio of the recess R1, it is difficult for the first plasma P1 to reach the bottom R1b rather than the side wall R1s of the recess R1, and thus, the first layer F1 is less likely to be formed on the bottom R1b of the recess R1.

Ammonia ($NH_3$) gas is highly reactive. Thus, when the ammonia ($NH_3$) gas is used for the first processing gas, it can be expected that the first layer F1 containing ammonia ($NH_3$), or a compound having an amino group ($-NH_2$) is formed on the side wall R1s of the recess R1 of the substrate W without using the first plasma P1.

In step ST1, as in step ST3 to be described below, the recess R1 may be formed through etching by using the first plasma P1. In this case, since the bottom R1b of the recess R1 is etched, the first layer F1 is less likely to be formed on the bottom R1b of the recess R1.

As illustrated in FIG. 6, in step ST2, for example, the first layer F1 is modified into a second layer F2 by using a second processing gas G2 without generating a plasma. In step ST2, the substrate W may be exposed to the second processing gas G2 without generating a plasma. The second processing gas G2 is different from the first processing gas. The second processing gas G2 is capable of modifying the first layer F1 into the second layer F2. The second processing gas G2 may be supplied from the gas supply 20 of the plasma processing apparatus 1 into the plasma processing chamber 10.

The second processing gas G2 contains a halogen-containing gas. The halogen-containing gas may contain a halogen compound having a polarity. The halogen compound may be hydrogen halide (HX: X is any one of F, Cl, Br, and I) or may be alkyl halide ($C_nH_{2n+1}X$: X is any one of F, Cl, Br, and I. n is an integer of 1 or more). The alkyl halide is, for example, $CH_3Br$ (bromomethane) or $C_2H_5Cl$ (chloroethane). The second processing gas G2 may not contain fluorocarbon gas.

The second layer F2 may be formed by reacting the halogen-containing gas with the first layer F1. The second layer F2 may function as a protective layer against etching in step ST3 to be described below. The second layer F2 is formed by modifying the first layer F1, and thus is less likely to be formed on the bottom R1b of the recess R1. The second layer F2 may contain ammonium halide ($NH_4X$: X is any one of F, Cl, Br, and I) or amine halide ($NH_2X$: X is any one of F, Cl, Br, and I).

After step ST2, purging may be performed within the plasma processing chamber 10. A purge gas may be supplied from the gas supply 20 of the plasma processing apparatus 1 into the plasma processing chamber 10.

As illustrated in FIG. 7, in step ST3, for example, a second plasma P2 is used to etch the bottom R1b of the recess R1. In step ST3, the substrate W may be exposed to the second plasma P2. The second plasma P2 is capable of etching the bottom R1b of the recess R1. The second plasma P2 is generated from a third processing gas. The second plasma P2 may be generated by the plasma generator 12 of the plasma processing apparatus 1. The third processing gas may be supplied from the gas supply 20 of the plasma processing apparatus 1 into the plasma processing chamber 10. The third processing gas is different from the second processing gas G2. The third processing gas may be different from the first processing gas, or may be the same as the first processing gas. The example of the third processing gas is the same as the example of the first processing gas.

In step ST3, a bias power may be applied to the substrate support 11 that supports the substrate W. The bias power may be applied by the power supply 30 in FIG. 2. The bias power increases the etching rate of the bottom R1b of the recess R1.

As illustrated in FIG. 8, in step ST4, it may be determined whether the depth DP of the recess R1 has reached the threshold value. The depth DP of the recess R1 may be monitored by, for example, an endpoint monitor. The determination may be performed by the controller 2 of the substrate processing apparatus. When the depth DP of the recess R1 has reached the threshold value, the method MT1 is ended. When the depth DP of the recess R1 has not reached the threshold value, the process returns to step ST1, and steps ST1 to ST4 are repeated. In step ST4, it may be determined whether the number of repetitions of steps ST1 to ST3 has reached the threshold value. In this manner, the method MT1 may further include a step of repeating steps ST1, ST2, and ST3 after step ST3.

When step ST3 is performed simultaneously with step ST1 subsequent to step ST3, the second plasma P2 also serves as the first plasma P1. As a result, the etching of the bottom R1b of the recess R1 and the formation of the first layer F1 are performed at the same time.

After the method MT1 is ended, the depth DP of the recess R1 may be 3 µm or more, and the aspect ratio of the recess R1 (the depth DP to the width WD of the recess R1) may be 30 or more. After the method MT1 is ended, the ratio (TH/DP) of the thickness TH of the mask MK to the depth DP of the recess R1 may be ⅕ or more.

According to the method MT1 of the embodiment, in step ST3, the etching of the side wall R1s of the recess R1 is suppressed because the second layer F2 is formed on the side wall R1s of the recess R1 . Therefore, it is possible to suppress a shape defect (bowing) of the side wall R1s of the recess R1 in the etching. Further, in step ST2, since plasma is not generated, the halogen-containing gas is not dissociated. Thus, the mask MK is suppressed from being etched by plasma. Therefore, it is possible to suppress the thickness TH of the mask MK from being decreased after step ST2.

Due to the second layer F2 formed on the side wall R1s of the recess R1, the etching of the side wall R1s of the recess R1 is suppressed, and the bottom R1b of the recess R1 is etched. However, what is etched is not limited to the bottom R1b of the recess R1. For example, as illustrated in FIG. 7, as the bottom R1b of the recess R1 is etched, the side wall R1s of the recess R1 on which the second layer F2 is not formed may be newly exposed, and the exposed side wall R1s of the recess R1 may be etched. When the aspect ratio of the recess R1 is high, in some cases, the second layer F2 may be formed on the upper portion of the side wall R1s of the recess R1, which is a place where a shape defect (bowing) is likely to occur, and may not be formed on the lower portion. In such a case, not only the bottom R1b of the recess R1, but also the side wall R1s of the recess R1 on which the second layer F2 is not formed may be etched. Due to an increase of the aspect ratio of the recess R1, the recess R1 is likely to have a tapered shape in which the dimension of the recess R1 is decreased from the upper end of the recess R1 toward the bottom R1b. However, by etching the side wall R1s of the recess R1, the dimension of the bottom R1b of the recess R1 may be widened.

Although various embodiments have been described above, various additions, omissions, substitutions, and changes may be made without being limited to the above-described embodiments. It is possible to combine elements in different embodiments to form another embodiment.

Hereinafter, descriptions will be made on various experiments performed for the evaluation of the method MT1. Experiments to be described below do not limit the present disclosure.

(First Experiment)

In the first experiment, a substrate W including a silicon nitride film and a mask MK on the silicon nitride film was prepared. Then, the method MT1 was executed on the substrate W by using the plasma processing system. First, step ST1 was performed. In step ST1, the first processing gas is a mixed gas of hydrogen gas, oxygen gas and fluorocarbon gas. In step ST1, by using the first plasma P1, a recess R1 was formed on the silicon nitride film, and at the same time, a first layer F1 was formed on the side wall R1s of the recess R1. Next, step ST2 was performed. In step ST2, the second processing gas is hydrogen bromide (HBr) gas. In step ST2, the hydrogen bromide gas was reacted with the first layer F1 to modify the first layer F1 into a second layer F2. Next, step ST3 was performed. In step ST3, the third processing gas is the same as the first processing gas. In step ST3, the bottom R1b of the recess R1 was etched, and at the same time, the first layer F1 was formed on the side wall R1s of the recess R1. That is, step ST3 was performed simultaneously with step ST1 subsequent to step ST3. Steps ST1 to ST3 were repeatedly performed.

(Second Experiment)

In the second experiment, as for the second processing gas, argon gas was used instead of hydrogen bromide gas. Other conditions are the same as in the first experiment.

(Experimental Result)

The cross section of the recess R1 of the substrate W on which the method MT1 was executed in the first experiment and the second experiment was observed, and the maximum value of the width WD of the recess R1 illustrated in FIG. 8 and the thickness TH of the mask MK were measured. When a dimensional defect (bowing) of the side wall of the recess R1 is suppressed, the maximum value of the width WD of the recess R1 is decreased. When the etching of the mask MK is suppressed, the thickness TH of the mask MK is increased. The measurement results are described below.

The maximum value of the width WD of the recess R1 was 126 nm in the first experiment, and was 142 nm in the second experiment. The thickness TH of the mask MK was 803 nm in the first experiment, and was 788 nm in the second experiment. In the first experiment, as compared to in the second experiment, the maximum value of the width WD of the recess R1 is decreased, and the thickness TH of the mask MK is also increased. Therefore, it was found that in the first experiment, the etching of the mask MK is suppressed and the shape defect on the side wall of the recess R1 in the etching is also suppressed.

According to one embodiment, it is possible to suppress a shape defect of the side wall of the recess in the etching.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing method comprising:
   (a) providing a substrate including an etching target film and a mask formed on the etching target film and having an opening;
   (b) forming a first layer by introducing a first processing gas that generates a first plasma which interacts with the etching target film, the first layer containing a nitrogen atom and a hydrogen atom, the first layer being formed on a side wall of a recess that is formed in the etching target film corresponding to the opening;
   (c) after (b), modifying the first layer into a second layer by using a second processing gas containing a halogen-containing gas, the second layer containing ammonium halide (NH4X, where X is any one of F, Cl, Br, and I) or amine halide (NH2X: X is any one of F, Cl, Br, and I); and
   (d) after (c), etching the opening by using a third processing gas.

2. The substrate processing method according to claim 1, wherein in (d), a second plasma generated from the third processing gas is used, and in (c), the second processing gas containing the halogen-containing gas is used without generating a plasma, and
   the second layer is a protective layer that is resistant to the etching step of (d).

3. The substrate processing method according to claim 1, further comprising:
   after (d), repeating (b), (c), and (d).

4. The substrate processing method according to claim 1, wherein the first layer contains ammonia or a compound having an amino group.

5. The substrate processing method according to claim 1, wherein in (d), a bias power is applied to a substrate support that supports the substrate.

6. The substrate processing method according to claim 1, wherein the first layer is formed directly on substantially an entire depth of a side wall of the opening of the substrate.

7. The substrate processing method according to claim 1, wherein in step (c), the second processing gas does not generate plasma to form the second layer, and
   the second layer is a protective layer that is resistant to the etching step of (d).

8. The substrate processing method according to claim 1, wherein the etching target film includes silicon oxide, and
   wherein the first processing gas is ammonia.

9. The substrate processing method according to claim 1, wherein the halogen-containing gas contains a halogen compound having a polarity.

10. The substrate processing method according to claim 9, wherein the halogen compound contains hydrogen halide.

11. The substrate processing method according to claim 1, wherein the etching target film includes a silicon-containing film.

12. The substrate processing method according to claim 11, wherein the silicon-containing film includes a silicon-containing film that contains nitrogen, and the first processing gas contains a hydrogen atom.

13. The substrate processing method according to claim 11, wherein the silicon-containing film includes a silicon-containing film that does not contain nitrogen, and the first processing gas contains a hydrogen atom and a nitrogen atom.

14. A substrate processing method comprising:
   (a) providing a substrate including an etching target film and a mask formed on the etching target film and having an opening;
   (b) exposing the substrate to a first processing gas, the first processing gas generating a first plasma that interacts with the etching target film to form a first layer containing a nitrogen atom and a hydrogen atom, the first layer being formed on a side wall of a recess that is formed in the etching target film corresponding to the opening;
   (c) after (b), exposing the substrate to a second processing gas containing a halogen- containing gas, the second processing gas modifying the first layer into a second layer, the second layer containing ammonium halide (NH4X, where X is any one of F, Cl, Br, and I) or amine halide (NH2X: X is any one of F, Cl, Br, and D); and
   (d) after (c), exposing the substrate to a third processing gas, the third processing gas etching the opening.

15. The substrate processing method according to claim 14, wherein the first layer is formed directly on substantially an entire depth of a side wall of the opening of the substrate.

16. The substrate processing method according to claim 14, wherein in step (c), the second processing gas does not generate plasma to form the second layer, and
   the second layer is a protective layer that is resistant to the etching step of (d).

17. The substrate processing method according to claim 14, wherein the etching target film includes silicon oxide, and
   wherein the first processing gas is ammonia.

18. A substrate processing apparatus comprising:
   a chamber;
   a substrate support configured to support a substrate within the chamber, the substrate including an etching target film and a mask formed on the etching target film and having an opening;
   a gas supply configured to supply at least one of a first processing gas, a second processing gas, and a third processing gas into the chamber, the second processing gas containing a halogen- containing gas; and
   a controller,
   wherein the controller is configured to control the gas supply to (a) form a first layer by interaction between a first plasma and the etching target film, the first layer containing a nitrogen atom and a hydrogen atom, by using the first processing gas that generates the first plasma, on a side wall of a recess that is formed in the etching target film corresponding to the opening, (b) after (a), modify the first layer into a second layer by using the second processing gas, the second layer containing ammonium halide (NH4X, where X is any one of F, Cl, Br and D) or amine halide (NH2X: X is any one of F, Cl, Br, and I), and (c) after (b), etch the opening by using the third processing gas.

* * * * *